(12) United States Patent
Johnson

(10) Patent No.: US 6,169,411 B1
(45) Date of Patent: *Jan. 2, 2001

(54) INTEGRATED CIRCUIT TESTING ASSEMBLY AND METHOD

(75) Inventor: Kenneth W. Johnson, Colorado Springs, CO (US)

(73) Assignee: Agilent Technologies, Palo Alto, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/867,379

(22) Filed: Jun. 2, 1997

Related U.S. Application Data

(62) Division of application No. 08/592,468, filed on Jan. 26, 1996, now Pat. No. 5,680,057, which is a continuation of application No. 08/178,187, filed on Jan. 6, 1994, now abandoned.

(51) Int. Cl.[7] .................................................. G01R 1/073
(52) U.S. Cl. ............................................ 324/757; 324/754
(58) Field of Search .................................. 324/757, 763, 324/754, 755, 758, 761, 762; 439/66, 71, 91, 68

(56) References Cited

U.S. PATENT DOCUMENTS

| | | | |
|---|---|---|---|
| 4,504,783 | * 3/1985 | Zasio et al. | 324/754 |
| 4,593,961 | * 6/1986 | Cosmo | 439/66 |
| 4,766,371 | * 8/1988 | Moriya | 324/763 |
| 4,843,313 | * 6/1989 | Walton | 439/91 |
| 4,874,318 | * 10/1989 | Spencer | 439/71 |
| 5,015,946 | * 5/1991 | Janko | 324/754 |
| 5,156,649 | * 10/1992 | Compton et al. | 439/68 |
| 5,247,246 | * 9/1993 | Van Loan et al. | 324/761 |
| 5,453,700 | * 9/1995 | Balyasny | 324/755 |

* cited by examiner

Primary Examiner—Ernest Karlsen

(57) ABSTRACT

An assembly and method for testing leads of an integrated circuit package. The assembly includes a testing substrate with a plurality of conductive portions for use in connection with a test probe. The assembly, further includes at least one compressible conductive bridge member for providing electrical contact between the leads of the integrated circuit package and the conductive portions of the testing substrate. The conductive bridge member has multiple electrically conductive wires embedded therein or secured thereto, each of the wires being parallel to one another and spaced apart from one another. The assembly uses a locator device for retaining the conductive bridge members therein and maintaining the conductive bridge members in electrical contact with the leads of the integrated circuit package and the conductive portions of the testing substrate.

3 Claims, 3 Drawing Sheets

INTEGRATED CIRCUIT TESTING ASSEMBLY AND METHOD

This is a divisional of application Ser. No. 08/592,468 filed on Jan. 26, 1996, now U.S. Pat. No. 5,680,057, which is a continuation of application Ser. No. 08/178,187 filed on Jan. 6, 1994, now abandoned.

BACKGROUND OF THE INVENTION

The present invention generally relates to circuit testing devices, and more particularly to an assembly and method for electrically contacting the leads of an integrated circuit package.

An integrated circuit package is typically comprised of integrated circuits packaged inside an insulated housing with a plurality of thin, parallel electrical leads extending outwardly from the housing. The leads of an integrated circuit package may be bent into various configurations including but not limited to a "gull-wing" lead configuration which is known in the art.

Circuit testing devices are used in various testing capacities such as, for example, verifying electrical continuity, measuring voltage output, etc. Such tests are frequently performed on the individual leads of an integrated circuit package by electrically contacting each lead with a test probe.

A typical loaded printed circuit board is usually crowded with various electrical components, including arrays of integrated circuit packages. Due to the close spacing of components on the board or "board density" as well as the small size and pitch or spacing of each integrated circuit package lead, it is often difficult to manipulate each lead with a test probe for testing purposes. Thus, circuit testing devices have been developed which conductively route each integrated circuit package lead to a device, e.g. a pin or the like, which is more easily manipulated by a test probe. In particular, circuit testing devices known as "test clips" typically include a spring-tensioned lead portion which "clips" onto an integrated circuit package to hold the circuit testing device leads firmly against the integrated circuit package leads. A significant amount of lateral force is required to hold a test clip in place against the integrated circuit package leads. For this reason, the center portion or "body" of a test clip must be sufficiently rigid to maintain this lateral force. In addition, there is generally a 1:1 ratio between the circuit testing device leads and the integrated circuit package leads, with the leads of both devices being approximately the same size. Thus, careful alignment of the circuit, testing device leads with the leads of the integrated circuit package is very important. The individual circuit testing device leads in a test clip are usually not insulated from one another, and so even a slight misalignment can result in a shorted electrical connection between the circuit testing device leads. In addition, test clips tend to have a larger overall size or "footprint" than the integrated circuit packages they clip onto. Thus, as the board density increases, so does the possibility that test clips will interfere with adjacent components.

Examples of test clips may be found in the 1993 Pomona Surface Mount & IC Test Accessories catalog, by ITT Pomona Electronics, 1500 E. Ninth St., Pomona, Calif. 91769, which is incorporated herein by reference for all that is contained therein. As shown in the catalog, to select the right test clip, the. following characteristics of the integrated circuit package to be tested must be determined: number of leads; package configuration (number of sides); lead pattern (e.g., 4×4, 7×7, 16×24, etc.); lead spacing; package type (e.g. DIP, PLCC, SOIC, QFP, etc.); standard (EIAJ or JEDEC); footprint; and interface (top side interconnection method). Using a test clip with characteristics that do not exactly match those of the integrated circuit package may result in electrical shorts or opens. Thus, test clips may not be available for certain integrated circuit packages which do not have industry-standard (i.e. EIAJ or JEDEC) characteristics. Furthermore, allowable tolerances in commercial products are sufficiently variable so that differences between manufacturers, or even between different plants of the same manufacturer, may require different test clips for devices with the same part number. For example, the leads of integrated circuit packages may be bent differently, the packages may be manufactured to English or Metric standards, or the housing portions of the packages may vary in size and/or shape. Finding a test clip for a particular integrated circuit package may therefore be difficult or impossible. Likewise, a test clip which matches the characteristics of a particular integrated circuit package may not be usable on another integrated circuit package with slightly different characteristics.

OBJECTS OF THE INVENTION

In accordance with the present invention, it is an object thereof to provide a circuit testing assembly which may be used on a wide variety of integrated circuit packages.

It is also an object of the invention to provide a circuit testing assembly which does not require the application of lateral forces to maintain electrical contact between the circuit testing device leads and the leads of an integrated circuit package.

It is also object of the invention to provide a circuit testing assembly which is relatively laterally compact as compared to spring-tensioned type lead contact assemblies.

It is another object of the invention to provide a circuit testing assembly which minimizes the effect of misalignment between the circuit testing device leads and the integrated circuit package leads.

It is a further object of the invention to provide a circuit testing assembly with individually insulated leads that minimize the problem of electrical shorts or opens among the leads.

It is a still further object of the invention to provide a circuit testing assembly which may be used on integrated circuit packages with the same number of leads and lead spacing regardless of differences in other characteristics.

It is an even further object of the invention to provide a circuit testing assembly which provides a plurality of leads for each integrated circuit package lead, thereby ensuring contact between the leads of both the circuit testing assembly and the integrated circuit package.

These and other objects, features, and advantages of the invention shall be described below in the following Summary of the Invention and Detailed Description of the Invention.

SUMMARY OF THE INVENTION

The present invention may comprise an assembly for testing the leads of an integrated circuit package. The assembly may comprise a testing substrate for use in connection with a test probe, the testing substrate comprising a plurality of conductive portions. The conductive portions may comprise a plurality of elongate conductive pins secured to the testing substrate and extending outwardly therefrom. The assembly may also comprise conductive bridge means for providing electrical contact between the leads of the integrated circuit package and the conductive portions of the testing substrate. The conductive bridge means may comprise at least one compressible bridge member having a plurality of electrically conductive wires embedded therein or secured to the surface of the bridge member, the wires being parallel to one another and spaced apart from one another. The assembly may further comprise locator means for retaining the conductive bridge means therein and maintaining the conductive bridge means in electrical contact with the leads of the integrated circuit package and the conductive portions of the testing substrate. The locator means may comprise mounting means for mounting the assembly to a circuit board. The locator means may also comprise at least one elongate opening therethrough, each opening having a bridge member positioned therein.

The present invention may also comprise a conductive bridge apparatus for providing electrical contact between leads of an integrated circuit package and conductive portions of a testing substrate. The conductive bridge apparatus may comprise an elongate insulating member comprised of compressible material. A plurality of electrically conductive wires may be embedded within the insulating member which are parallel to one another and spaced apart from one another within the insulating member.

The present invention may further comprise a method for testing the leads of an integrated circuit package on a circuit board. The method may comprise the steps of: (a) providing a circuit testing assembly such as that described above; (b) positioning the circuit testing assembly on the circuit board and over the integrated circuit package; and (c) aligning the conductive bridge means with the leads of the integrated circuit package so that at least one of the wires in the bridge member of the conductive bridge means is in contact with each of the leads of the integrated circuit package.

BRIEF DESCRIPTION OF THE DRAWINGS

An illustrative and presently preferred embodiment of the invention is shown in the accompanying drawings in which.

DETAILED DESCRIPTION OF THE INVENTION

Figure 1:
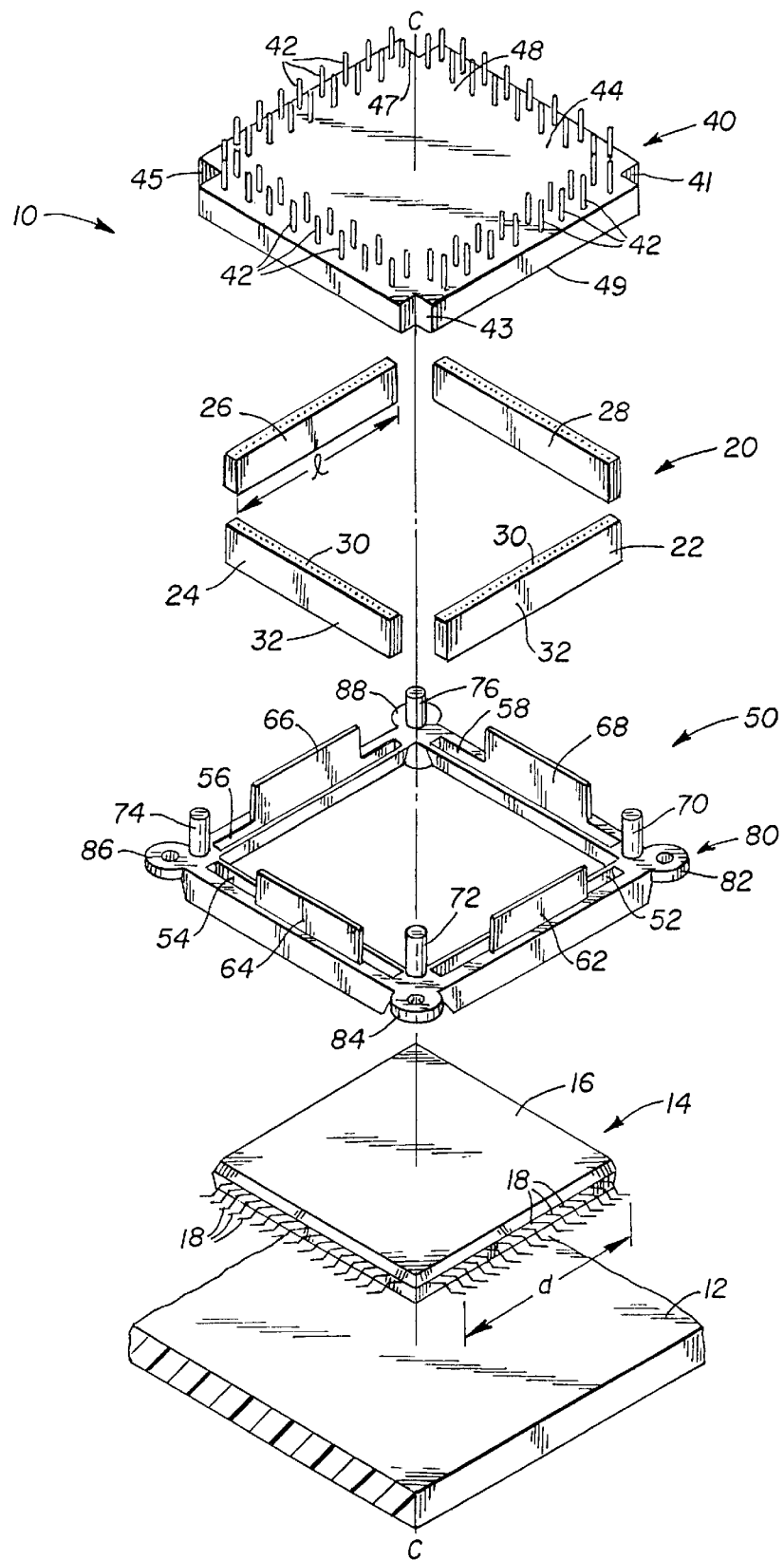
FIG. 1 is an exploded, perspective view of the circuit testing assembly of the present invention in association with an exemplary integrated circuit package and circuit board.

FIG. 1 illustrates the circuit testing assembly 10 of the present invention. A portion of a printed circuit board 12, as well as an exemplary integrated circuit package 14, are also shown. The integrated circuit package 14 may be comprised of integrated circuits (not shown) packaged inside an insulated housing 16, with a plurality of thin, parallel electrical leads 18 extending outwardly from the housing 16. The integrated circuit package 14 may be of a type well-known in the art such as, e.g., a ceramic quad flat pack (CQFP); a plastic quad flat pack (PQFP); a thin quad flat pack (TQFP); fine pitch quad flat pack (FQFP); or a metal and ceramic quad flat pack (MQFP). The integrated circuit package 14 is typically mounted on the circuit board 12 by soldering the leads 18 of the integrated circuit package 14 to the board 12 in a conventional manner.. A central longitudinal axis CC passes through the geometric center of the integrated circuit package 14 and the geometric center of the circuit testing assembly 10 as shown in FIG. 1.

Figure 2:
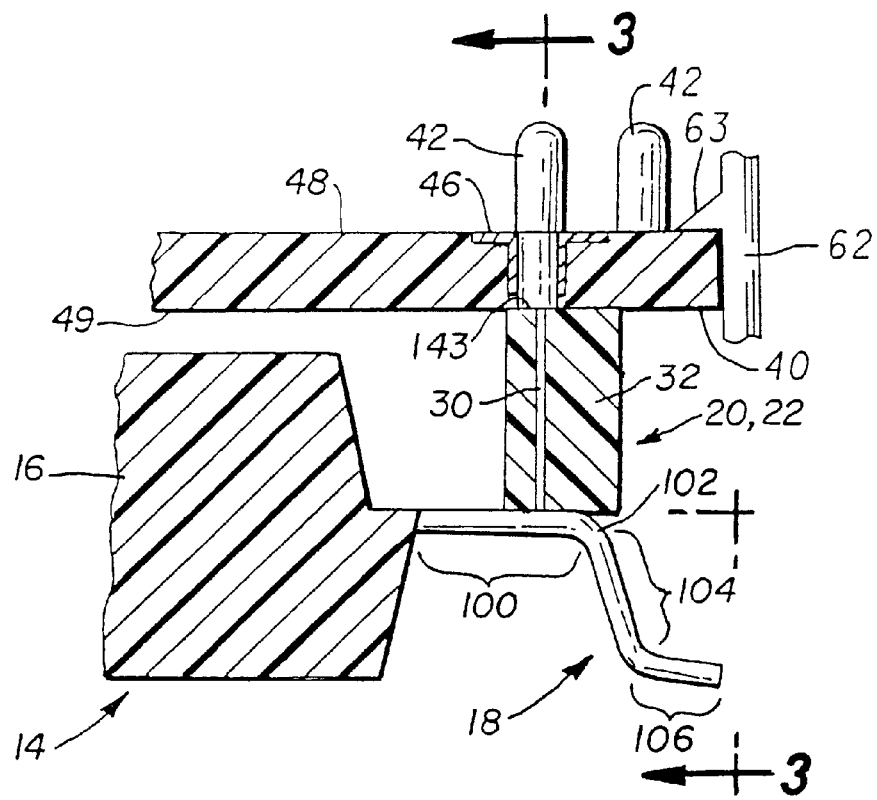
FIG. 2 is a side, enlarged, sectional view of an integrated circuit package lead in association with the circuit testing assembly of FIG. 1.
Figure 3:
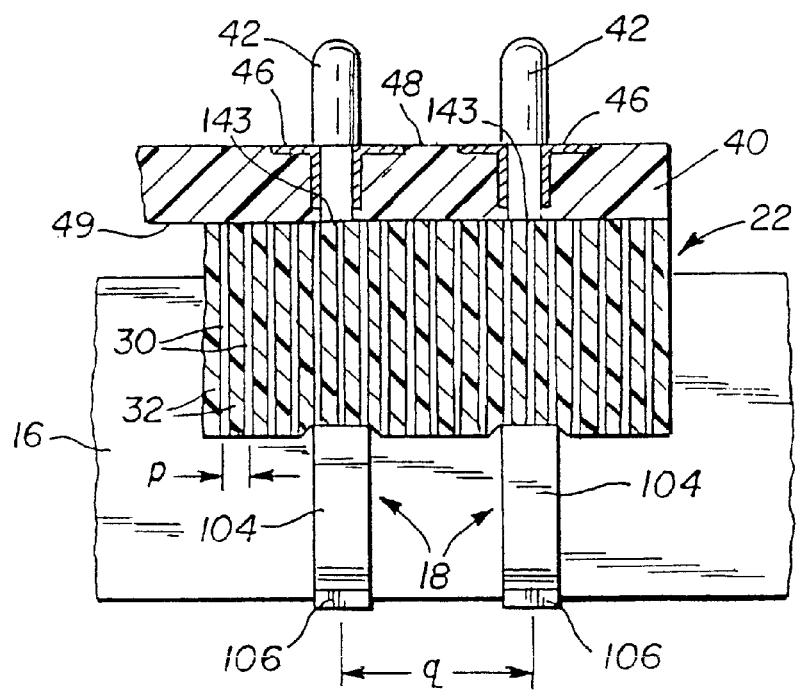
FIG. 3 is a front, enlarged, sectional view of two integrated circuit package leads in association with the circuit testing assembly of FIG. 1 taken along lines 3—3 of FIG. 2.

The circuit testing assembly 10 of the present invention may comprise a conductive bridge means 20 for providing electrical contact between the integrated circuit package leads 18 and a testing substrate 40. The conductive bridge means 20 includes at least one, and preferably four, compressible bridge members 22, 24, 26, 28. Each bridge member 22, 24, 26, 28 comprises a plurality of parallel, electrically conductive wires 30 secured to a compressible insulating member 32. The wires 30 may be secured to the compressible insulating member 32 by embedding the wires 30 within the insulating member 32 as shown in FIGS. 1–3. In an alternative embodiment shown in FIG. 4 and described in further detail below, the wires 30 may also be secured to the surface portion 124 of the insulating member 152. The wires 30 are each positioned in parallel relationship to one another and to the central longitudinal axis CC, and are preferably constructed of gold-plated brass. Furthermore, the wires 30 are spaced apart from each other as shown, and may be molded directly into the member 32 during the production thereof. The insulating member 32 is preferably constructed from a flexible, deformable elastomeric material such as silicone rubber.

Still referring to FIG. 1, a frame-like locator means 50, which is preferably constructed from plastic, is provided for housing the conductive bridge means 20 so that electrical contact between the integrated circuit package leads 18 and the testing substrate 40 may be provided by the conductive bridge means 20. More specifically, the locator means 50 comprises retaining portions 52, 54, 56, 58 located around the periphery of the locator means 50 as shown in FIG. 1. Each bridge member 22, 24, 26, 28 is positioned within a retaining portion 52, 54, 56, 58, respectively, of the locator means 50. Each retaining portion 52, 54, 56, 58 is preferably in the form of a linear, bar member having an elongate, slot-like opening which passes entirely through the locator means 50. The testing substrate 40, which is preferably constructed from plastic, is positioned within the locator means 50 directly above and adjacent to the conductive bridge means 20, and comprises a plurality of electrically conductive portions 42 which extend from the bottom surface 49, through the testing substrate 40, and outwardly from the top surface 48 of the testing substrate 40 (FIGS. 1 and 3). The electrically conductive portions 42 may comprise conventionally-known pins or the like which may be positioned within a seat portion 46 as shown in FIGS. 2 and 3. The conductive portions 42 may be ultimately used as electrical terminals which are easily placed in contact with a test probe (not shown) due to the large size of such portions 40 compared to the integrated circuit package leads 18. Although a dual-row, perimeter pin array is shown in FIG. 2, an area array or various other pin patterns could also be used.

As illustrated in FIGS. 1–3, when the bridge members 22, 24, 26, 28 are positioned within the retaining portions 52, 54, 56, 58, the bridge members 22, 24, 26, 28 are located directly above and adjacent to the integrated circuit package leads 18, and directly below and adjacent to the electrically conductive portions 42 of the testing substrate 40. In this manner, when the entire system of FIG. 1 is assembled, the conductive bridge means 20 maintains electrical contact between the integrated circuit package leads 18 and the electrically conductive portions 42 of the testing substrate 40.

The locator means 50 may also comprise posts 70, 72, 74, 76 (FIG. 1) or the like which may abut against corner portions 41, 43, 45, 47 of the testing substrate 40 with a precision-fit type of engagement. These posts 70, 72, 74, 76 assist in aligning the testing substrate 40 within the locator means 50 so that the testing substrate 40 may be compressively held against the bridge means 20. The locator means 50 may further comprise a plurality of planar members 62, 64, 66, 68, which securely retain the testing substrate 40 in a proper orientation, compressively held against the bridge means. The planar members 62, 64, 66, 68 may comprise tabs (not shown) or the like so that the testing substrate 40 may be snap-fit into place and held by the tabs to maintain the substrate 40 under pressure and to thus compress the bridge means between the substrate 40 and the circuit package leads 18. Various other hold-down devices for providing the compression holding may also be employed such as clamping members, screws, etc. The planar members 62, 64, 66, 68 also abut against the bridge members 22, 24, 26, 28 and assist in securely retaining the bridge members 22, 24, 26, 28 in a proper orientation within the locator means 50 so that the wires 30 are maintained in a parallel orientation with the central longitudinal axis CC.

The foregoing components of the circuit testing assembly 10 may be temporarily or permanently mounted to the circuit board 12 in a conventional manner. In a preferred embodiment as shown in FIG. 1, the locator means 50 may further comprise annular, tab-like mounting means 80 for mounting the circuit testing assembly 10 to the circuit board 12. The tab-like mounting means 80 may further comprise mounting portions 82, 84, 86, 88 located on the corners of the locator means 50 as shown in FIG. 1. The mounting portions 82, 84, 86, 88 may comprise bores as shown for receiving a screw or the like which may then be driven into corresponding bores or bosses (not shown) in the circuit board 12. In one procedure for mounting the locator means 50 on the circuit board 12, the locator means 50 is initially placed on the board 12 in circumscribing relationship with the integrated circuit package 14. The frame-like locator means 50 is configured to closely receive the integrated circuit package 14 therewithin. Bores in mounting portions 82, 84, 86, 88 are then used as templates for drilling bores (or locating and gluing pre-drilled bosses or the like) (not shown) into circuit board 12. Finally, screws (not shown) are used to secured the locator means 50 to the circuit board 12. Alternatively, the locator means 50 may be permanently glued to the circuit board 12.

The integrated circuit package leads 18 may be of a type known in the art as "gull-wing" leads. As shown in FIG. 2, each "gull-wing" lead 18 comprises a first portion 100 where the lead 18 exits the housing 16 of the integrated circuit package 18, a second portion 102 (commonly referred to as the "knee") where the lead 18 bends downwardly, a third portion 104 just below the knee, and a fourth portion 106 (commonly referred to as the "foot") where the lead 18 contacts a circuit board (e.g. element 12, FIG. 1). In a preferred embodiment as shown in FIG. 2, each wire 30 of the bridge member 22 contacts the first portion 100 of one of the leads 18. In alternative embodiments (not shown), the wires 30 may contact other portions of the lead 18 such as the foot 106. As shown in FIGS. 2 and 3, each wire 30 of the bridge member 22 also contacts the bottom surface 143 of the electrically conductive portions 42.

As described above, previously known test clips comprise a spring-tensioned lead portion which uses lateral force to maintain contact between the test clip leads and the integrated circuit package leads. Such spring-tensioned leads are susceptible to bending and misalignment and also occupy a relatively large amount of lateral space. Conversely, the conductive bridge means 20 of the present invention uses compressive force to maintain contact with the integrated circuit package leads 18. This compressive force is provided in part by the testing substrate 40 pushing down on the resilient conductive bridge means 20 as shown in FIGS. 2 and 3 when the testing substrate 40 is securely, compressively held within the locator means (removed from these figures for clarity) as previously described with reference to FIG. 1. This compressive force is also provided by mounting the locator means 50 (FIG. 1) to the circuit board 12 as described above. Thus, the present invention does not require any lateral force to maintain contact between the conductive bridge means 20 and the testing substrate 40, and the need for a spring-tensioned lead portion is obviated. Also, since the wires 30 in the conductive bridge means 20 do not project laterally, a laterally compact testing assembly 10 may be provided.

Also as mentioned above, the center portion, or "body", of conventional test clips must be sufficiently rigid to maintain the required lateral force. Since the circuit testing assembly 10 of the present invention does not require any lateral force to maintain electrical contact, the center portion 44 of the testing substrate 40 (FIG. 1) need not be rigidly constructed. For example, the center portion 44 of the testing substrate 40 may comprise a plurality of holes (not shown) for receiving a test probe. Alternatively, the center portion 44 of the testing substrate 40 may comprise active components, a heat sink, or other elements. Furthermore, the center portion 44 of the testing substrate 40 may be completely removed.

As shown schematically in FIG. 3, each conductive wire 30 is spaced apart and electrically insulated from one another by embedding the wires 30 within the compressible, deformable insulating member 32. The centerline-to-centerline spacing, or distance "p", between the wires 30 is significantly smaller than the distance "q" between the integrated circuit leads 18. More specifically, "p" is preferably about 1/10 of "q". Thus, a plurality of wires 30 contact each individual integrated circuit package lead 18. As a result, electrical contact between each lead 18 and at least one of the wires 30 is ensured. Furthermore, misalignment of the bridge member 22 will not destroy the electrical contact between an integrated circuit package lead 18 and the testing substrate 40 since it is substantially certain that at least one of the wires 30 would still be in contact with the selected lead 18.

Referring again to FIG. 1, to maintain electrical contact with all of the integrated circuit package leads 18, the length "l" of each bridge member 22, 24, 26, 28 must be equal to or greater than the distance "d" of the particular row of integrated circuit package leads 18 associated therewith. It can thus be seen that, to correctly size a circuit testing device 10 to a particular integrated circuit package 14, the lead spacing and number of leads for the integrated circuit package 14 must be determined. However, the circuit testing device 10 of the present invention is independent of other integrated circuit package characteristics such as package height, standard (EIAJ or JEDEC), stand-off height, or foot print. Thus, a particular circuit testing device 10 may be used on any integrated circuit package 14 with the same number of leads and lead spacing, regardless of differences in other characteristics.

Figure 4:
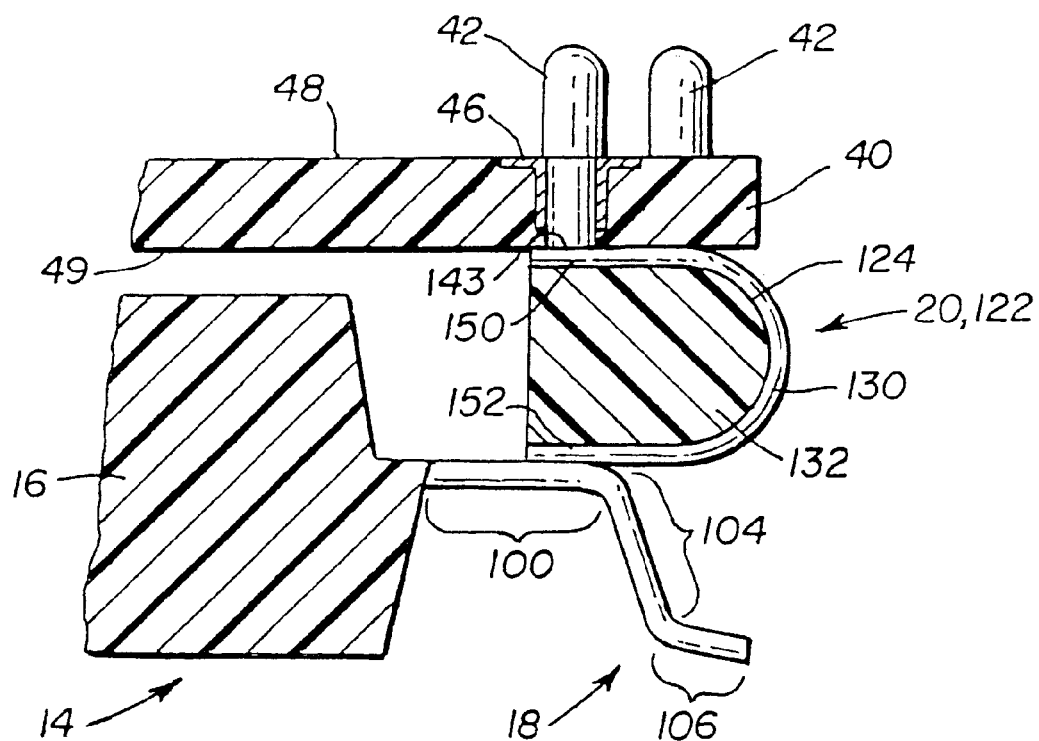
FIG. 4 is side, enlarged, sectional view of an integrated circuit package lead in association with another embodiment of the circuit testing assembly of FIG. 1.

FIG. 4 illustrates an alternative embodiment of the conductive bridge means 20 of FIGS. 1–3. Except where otherwise noted below, the invention of FIG. 4 is substantially identical to that described above with reference to FIGS. 1–3. As shown in FIG. 4, the conductive bridge means 20 may comprise at least one compressible bridge member 122. Each bridge member 122 preferably comprises a compressible insulating member 152 which may be substantially U-shaped in cross-section. The insulating member 152 may comprise a surface portion 124 having a plurality of parallel, spaced-apart, electrically conductive wires 130 (only one shown). The wires 130 may be secured to the surface portion 124 with an adhesive or the like. For example, an adhesive layer (not shown) may be applied to the surface portion 124, and then the wires 130 may be positioned on the adhesive layer so that the wires 130 conform to the cross-sectional shape of the surface portion 124 as shown in FIG. 4. A first section 150 of each wire 130 may contact the bottom surface 143 of each conductive portion 42, and a second section 152 of each wire 130 may contact the first portion 100 of an integrated circuit package lead 18. As described above with reference to FIGS. 1–3, the second section 152 may alternatively contact another portion (e.g., portion 104 or 106) of the integrated circuit package lead 18. Electrical contact between the conductive portions 42 and the integrated circuit package leads 18 is maintained through the use of compressive force as described above with reference to FIGS. 1–3.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

I claim:

1. A method for testing leads of an integrated circuit package which is mounted on a circuit board, comprising:
   a) providing a circuit testing assembly comprising conductive bridge means for providing electrical contact between said leads of said integrated circuit package and conductive portions of a testing substrate, said conductive bridge means comprising at least one compressible bridge member having a plurality of electrically conductive wires embedded therewithin;
   b) positioning said circuit testing assembly on said circuit board and over said integrated circuit package without removing said integrated circuit package from said circuit board such that said testing substrate is positioned directly above said integrated circuit package;
   c) aligning said compressible bridge member with said leads of said integrated circuit package so that a plurality of said wires in said compressible bridge member are in direct contact with each of said leads of said integrated circuit package; and
   d) providing a compressive force to said compressible bridge member during said testing of said leads of said integrated circuit package to maintain contact between said wires in said compressible bridge member and said leads of said integrated circuit package during said testing.

2. The method of claim 1 comprising the further step of contacting at least one of said conductive portions of said testing substrate with a test probe.

3. The method of claim 1 wherein the step of providing a compressive force to said compressible bridge member is accomplished by mounting said circuit testing assembly to said circuit board.

* * * * *